United States Patent
Kiyohara (10) Patent No.: US 10,410,904 B2
(45) Date of Patent: Sep. 10, 2019

(54) PEELING METHOD AND PEELING APPARATUS

(71) Applicant: DISCO CORPORATION, Tokyo (JP)

(72) Inventor: Kosei Kiyohara, Tokyo (JP)

(73) Assignee: Disco Corporation, Tokyo (JP)

( * ) Notice: Subject to any disclaimer, the term of this patent is extended or adjusted under 35 U.S.C. 154(b) by 155 days.

(21) Appl. No.: 15/673,018

(22) Filed: Aug. 9, 2017

(65) Prior Publication Data

US 2018/0053680 A1 Feb. 22, 2018

(30) Foreign Application Priority Data

Aug. 18, 2016 (JP) ................................. 2016-160493

(51) Int. Cl.
 *H01L 21/683* (2006.01)
 *H01L 21/67* (2006.01)

(52) U.S. Cl.
 CPC .... *H01L 21/6836* (2013.01); *H01L 21/67132* (2013.01)

(58) Field of Classification Search
 CPC .................. H01L 21/67132; H01L 21/6836
 USPC ........................................................ 438/800
 See application file for complete search history.

(56) References Cited

U.S. PATENT DOCUMENTS

| 5,891,298 A * | 4/1999 | Kuroda | H01L 21/56 156/241 |
|---|---|---|---|
| 2006/0199382 A1* | 9/2006 | Sugiyama | H01L 21/67132 438/670 |
| 2011/0198040 A1* | 8/2011 | Ebata | B65H 41/00 156/750 |
| 2013/0014905 A1* | 1/2013 | Nakazawa | B32B 43/006 156/712 |
| 2014/0150981 A1* | 6/2014 | Itou | B32B 38/1858 156/714 |
| 2014/0332166 A1* | 11/2014 | Honda | H01L 21/67092 156/708 |

FOREIGN PATENT DOCUMENTS

JP 2012-151275 8/2012

* cited by examiner

*Primary Examiner* — Duy T Nguyen
(74) *Attorney, Agent, or Firm* — Greer Burns & Crain, Ltd.

(57) ABSTRACT

Disclosed is a method of peeling a protective member from a wafer, the protective member composed of a resin and a film, the film attached to one side of the wafer through the resin in a state in which a protruding portion is formed. The method includes: a step of holding the other side of the wafer, with the protective member on the lower side; an outer circumferential edge adhered resin peeling step of grasping the protruding portion of the protective member, and pulling the protruding portion to an outer side than an outer circumferential edge of the wafer, to peel the resin adhered to the outer circumferential edge of the wafer from the outer circumferential edge of the wafer; and a step of peeling, after the outer circumferential edge adhered resin peeling step, the whole body of the protective member from the wafer.

2 Claims, 7 Drawing Sheets

PEELING METHOD AND PEELING APPARATUS

BACKGROUND OF THE INVENTION

Field of the Invention

The present invention relates to a peeling method and a peeling apparatus for peeling a protective member from a wafer.

Description of the Related Art

In the case of producing a wafer having flat surfaces in the semiconductor wafer manufacturing process, for example, a cylindrical ingot of raw material such as silicon is sliced by a wire saw or the like, to obtain disk-shaped wafer. Since undulation is frequently present on both sides of the disk-shaped wafer, the sliced wafer is subjected to grinding. Specifically, a rotating grindstone is put into contact with the wafer's surface cut by the wire saw or the like, to remove undulation from the cut surface and obtain a flat surface.

In performing the grinding, a protective tape or the like is attached to one side of the wafer, for protecting the one side. In the case of protecting one side of the wafer with a protective tape, since the thickness of the paste on the adhesive surface of the protective tape is insufficient, the protective tape is adhered to the one side of the wafer in a state in which the other side of the wafer is free of undulation. When the protective tape is peeled from the one side of the wafer after the other side of the wafer is ground, therefore, undulation would again occur on the other side of the wafer, resulting in that the undulation on the other side of the wafer has not been removed.

Figure 10:
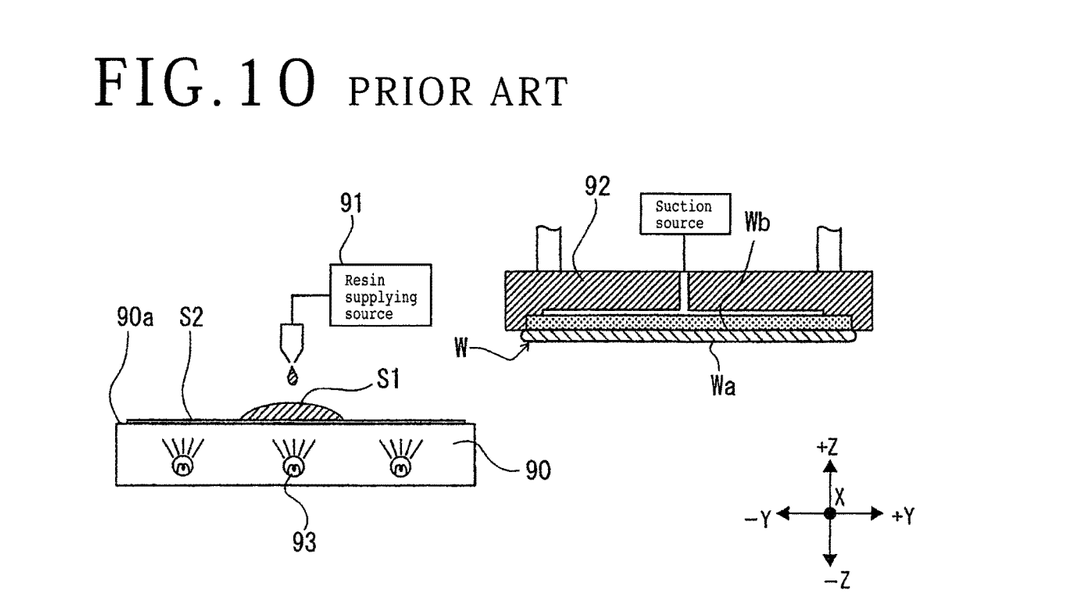
FIG. 10 is a schematic illustration for explaining a state in which a protective member is being formed from a liquid resin on one side of a wafer.
Figure 11:
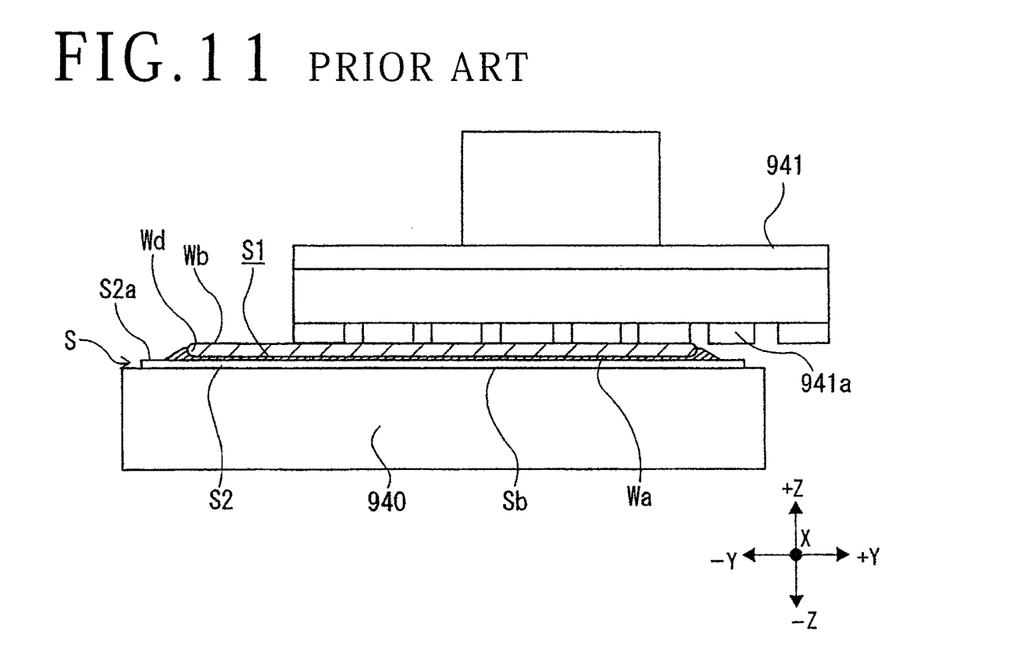
FIG. 11 is a side view depicting a state in which the protective member is held and the other side of the wafer is being ground.

In view of the foregoing, in performing the grinding, for example, as depicted in FIG. 10, a protective member is formed from a liquid resin S1 on one side Wa of the disk-shaped wafer W. When the liquid resin S1 is spread by pressing and the liquid resin S1 is cured, the protective member can be formed on one side Wa of the wafer W in a state in which the other side Wb of the wafer W has undulation. Then, the other side Wb of the wafer W is ground, whereby the undulation on the other side Wb of the wafer W can be removed. To form the protective member on the wafer W, for example, a stretchable circular film S2 larger than the wafer W in diameter is placed on a flat holding surface 90a of a holding table 90 of a protective member forming apparatus, and a predetermined amount of liquid resin S1 is supplied onto the film S2 from a resin supplying source 91. The resin S1 has a property of being cured by light (typically, ultraviolet (UV) rays), for example. Then, the other side Wb of the wafer W is suction held by holding means 92, and, on the film S2 disposed to face the one side Wa of the wafer W, the wafer W is pressed against the liquid resin S1 from above, thereby spreading the liquid resin S1 such that the whole area of the one side Wa of the wafer W is coated with the liquid resin S1. Next, the liquid resin S1 is cured by irradiation with UV rays from a UV ray irradiation mechanism 93 disposed inside the holding table 90, whereby a protective member S depicted in FIG. 11 is formed. In addition, the film S2 protrudes from an outer circumferential edge Wd of the wafer W to form a protruding portion S2a.

Then, as depicted in FIG. 11, the wafer W is placed on a holding surface of a chuck table 940 of a grinding apparatus 94 such that the other side Wb not provided with the protective member S thereon is located on the upper side, and a rotating grinding wheel 941 is lowered from above the wafer W, to bring grindstones 941a into contact with the other side Wb of the wafer W, thereby grinding. Thereafter, the protective member S is peeled from the wafer W by a peeling apparatus (see, for example, Japanese Patent Laid-open No. 2012-151275), and the one side Wa of the wafer W having been protected with the protective member S is further ground, whereby a wafer W having flat surfaces freed from undulation can be produced.

SUMMARY OF THE INVENTION

When the protective member S is formed on one side Wa of the wafer W by spreading the liquid resin S1 under pressure, the liquid resin S1 is adhered to the outer circumferential edge Wd of the wafer W, as depicted in FIG. 11. For example, in the peeling apparatus described in Japanese Patent Laid-open No. 2012-151275, a pushing force is exerted on the liquid resin S1 adhered to the outer circumferential edge Wd of the wafer W, whereby the liquid resin S1 adhered to the outer circumferential edge Wd of the wafer W is peeled from the outer circumferential edge Wd of the wafer W. However, it is difficult to appropriately push the liquid resin S1 adhered to the outer circumferential edge Wd of the wafer W. In addition, in the case where the cured liquid resin S1 is stretchable and elastic, it is difficult to peel the cured liquid resin S1 from the outer circumferential edge Wd of the wafer W by only pushing the liquid resin S1 adhered to the outer circumferential edge Wd of the wafer W.

Accordingly, it is an object of the present invention to provide a peeling method and a peeling apparatus by which a resin of a protective member adhered to an outer circumferential edge of a wafer can be easily peeled from the outer circumferential edge of the wafer, independently of the rigidity of the resin.

In accordance with an aspect of the present invention, there is provided a peeling method of peeling a protective member from a wafer, the protective member including a resin and a film, the film attached to one side of the wafer through the resin in a state in which the film protrudes from an outer circumferential edge of the wafer to form a protruding portion, the peeling method including: a holding step of holding the other side of the wafer by suction; an outer circumferential edge adhered resin peeling step of grasping the protruding portion of the protective member for the wafer held in the holding step, and pulling the protruding portion to an outer side than the outer circumferential edge of the wafer, to peel the resin adhered to the outer circumferential edge of the wafer from the outer circumferential edge of the wafer; and a whole body peeling step of peeling, after the outer circumferential edge adhered resin peeling step, the whole body of the protective member from the wafer.

In accordance with another aspect of the present invention, there is provided a peeling apparatus for peeling a protective member from a wafer, the protective member including a resin and a film, the film attached to one side of the wafer through the resin in a state in which the film protrudes from an outer circumferential edge of the wafer to form a protruding portion, the peeling apparatus including: holding means having a holding surface on which to hold the other side of the wafer; outside portion peeling means for grasping the protruding portion and peeling an outside portion of the protective member from the wafer; and whole body peeling means for peeling the whole body of the protective member from the wafer, wherein the outside portion peeling means includes a first grasping section for grasping the protruding portion, a vertical movement section for moving the first grasping section in a direction perpendicular to the holding surface, and a horizontal movement section for moving the first grasping section in a direction of the holding surface, the whole body peeling means includes a second grasping section for grasping the protruding portion, and moving means for moving the second grasping section from an outer circumference of the wafer toward an outer circumference on the opposite side with reference to the center of the wafer, and the protruding portion of the protective member for the wafer held by the holding means is grasped by the first grasping section, the first grasping section is moved to an outer side than an outer circumferential edge of the wafer by the horizontal movement section, and the protruding portion is pulled to peel the resin adhered to the outer circumferential edge of the wafer, after which the first grasping section is moved in a direction for spacing away from the one side of the wafer by the vertical movement section to peel an outside portion of the protective member, and, further, the protruding portion is grasped by the second grasping section and the second grasping section is relatively moved from an outer circumference of the wafer toward an outer circumference on the opposite side with reference to the center of the wafer to peel the whole body of the protective member.

Preferably, the holding means includes rotating means for rotating the holding surface about the center of the holding surface.

According to the peeling method of the present invention, the resin adhered to the outer circumferential edge of the wafer can be peeled from the outer circumferential edge of the wafer, by a simple operation of grasping and pulling the protruding portion in the outer circumferential edge adhered resin peeling step, and independently of rigidity of the resin, and, then, the whole body of the protective member can be easily peeled from the wafer, without leaving the resin on the outer circumferential edge of the wafer, by peeling the whole body of the protective member from the wafer.

The peeling apparatus of the present invention has a apparatus configuration optimum for carrying out the peeling method according to the present invention, whereby the resin adhered to the outer circumferential edge of the wafer can be peeled from the outer circumferential edge of the wafer, by a simple operation of grasping and pulling the protruding portion, and the whole body of the protective member can be easily peeled from the wafer, without leaving the resin on the outer circumferential edge of the wafer.

Preferably, the holding means in the peeling apparatus according to the present invention includes rotating means for rotating the holding surface about the center of the holding surface. Therefore, the step of peeling the resin adhered to the outer circumferential edge of the wafer from the outer circumferential edge of the wafer can be carried out at a plurality of parts of the outer circumferential edge of the wafer, easily by rotating the holding surface on which the wafer is held.

The above and other objects, features and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

Figure 1:
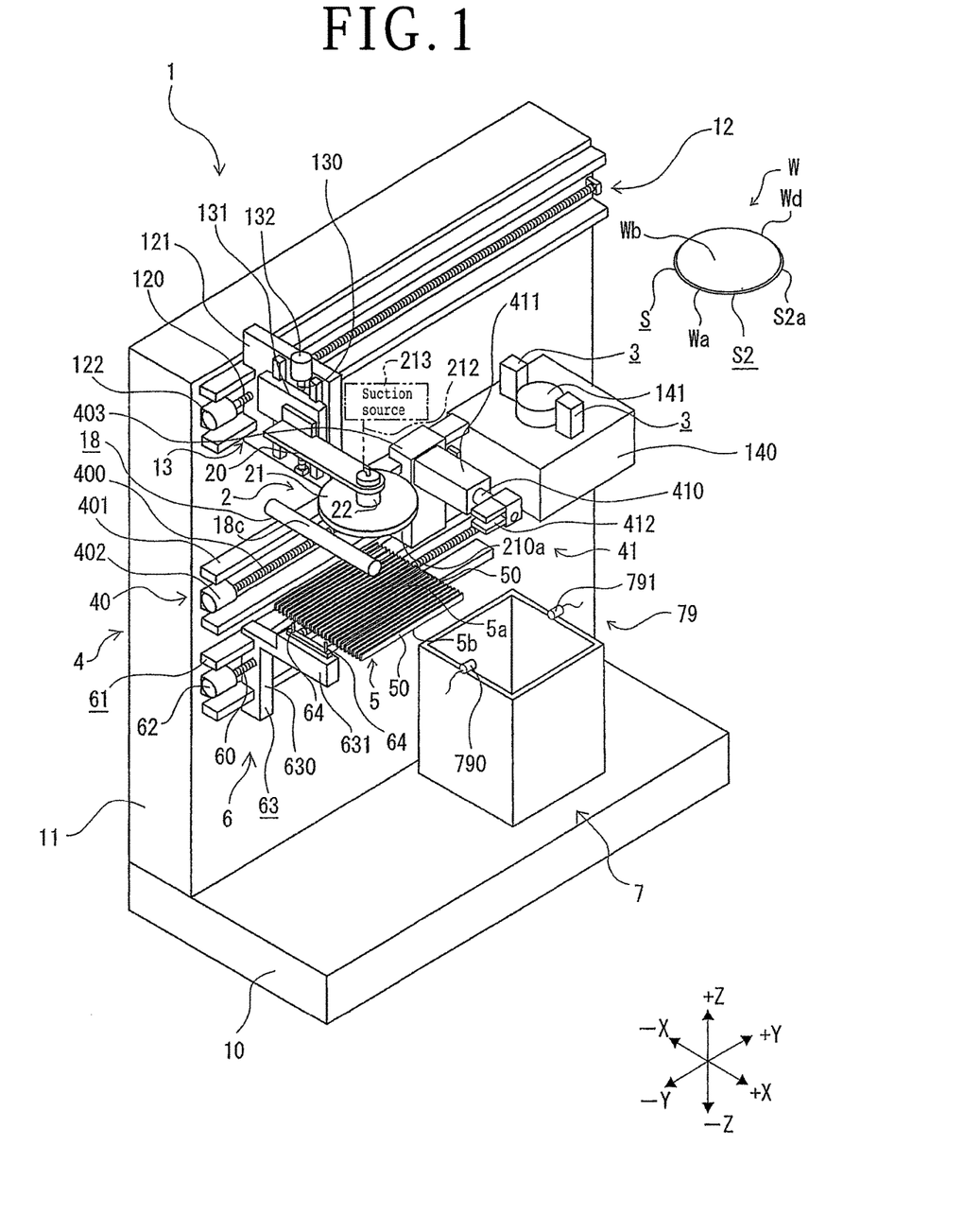
FIG. 1 is a perspective view depicting an example of a peeling apparatus.
Figure 2:
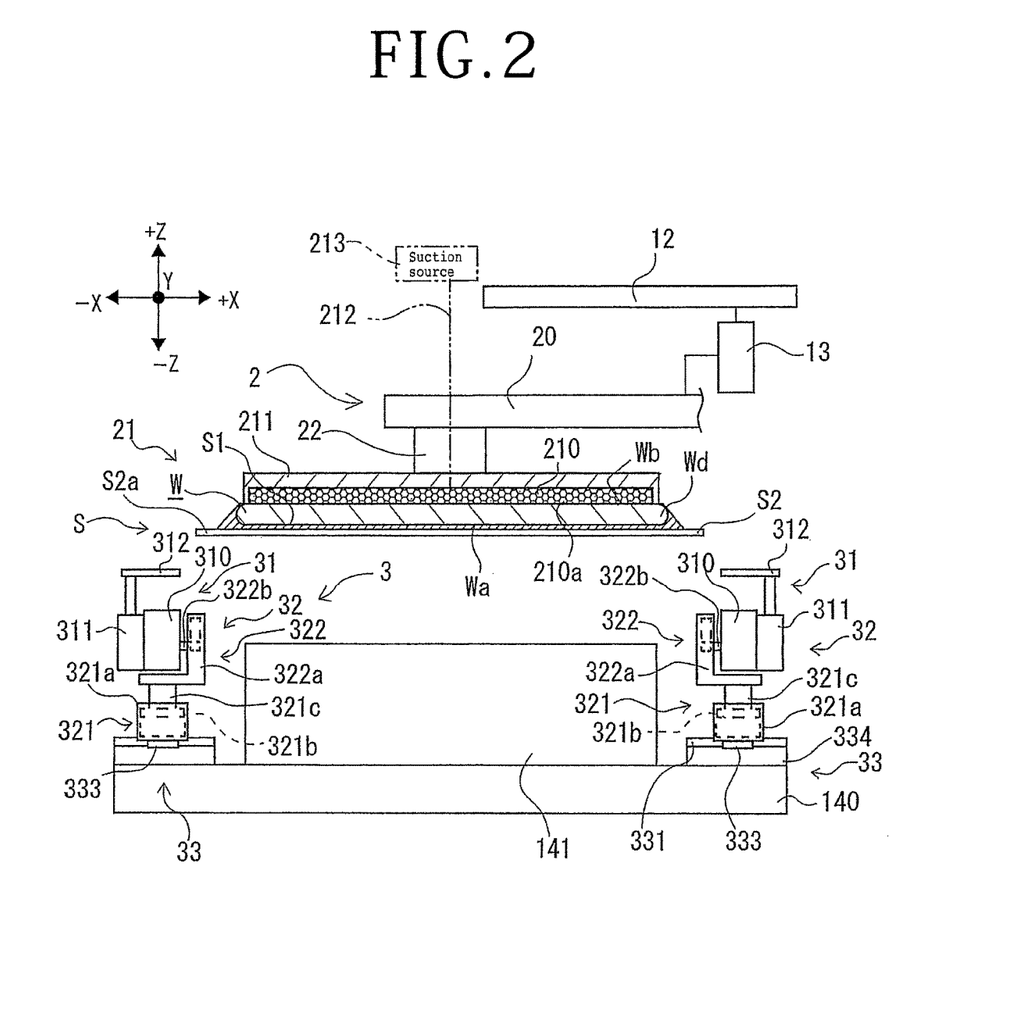
FIG. 2 is a sectional view depicting an example of structures of holding means and outside portion peeling means.

A peeling apparatus 1 depicted in FIG. 1 is a apparatus for peeling a protective member S from a wafer W. The protective member S depicted in FIGS. 1 and 2 is formed to be larger than the wafer W in diameter, is attached to one side Wa of the wafer W, and has a protruding portion S2a which protrudes to an outer side than an outer circumferential edge Wd of the wafer W.

A column 11 is erected on a rear side (−X direction side) on a base 10 of the peeling apparatus 1 depicted in FIG. 1, and Y-axis direction moving means 12 by which holding means 2 disposed on a movable plate 121 is reciprocated by rotating a ball screw 120 by a motor 122 is disposed at an upper portion of a side surface on a +X direction side of the column 11.

On the movable plate 121 is disposed Z-axis direction moving means 13 by which the holding means 2 is reciprocated in a Z-axis direction. The Z-axis direction moving means 13 reciprocates the holding means 2 disposed on a movable plate 131 in the Z-axis direction, by rotating a ball screw 130 by a motor 132.

The holding means 2 which holds the wafer W includes: an arm section 20 with its one end on the −X direction side being fixed on the movable plate 131; and a holding pad 21 which is disposed near a lower surface of the other end on the +X direction side of the arm section 20 through rotating means 22 and which is able to hold the wafer W by suction. As illustrated in FIG. 2, the holding pad 21 includes a suction contact section 210 formed of a porous material and sucking the wafer W thereon, and a frame body 211 which supports the suction contact section 210. The suction contact section 210 communicates with a suction source 213 through a suction pipe 212 extending through the inside of the rotating means 22. A suction force generated by suction by the suction source 213 is transmitted to a holding surface 210a, which is an exposed surface of the suction contact section 210 and is formed flush with a lower surface of the frame body 211, whereby the holding means 2 holds the wafer W on the holding surface 210a by suction. The rotating means 2 composed of a spindle, a motor and the like can rotate the holding pad 21 about its axis which passes the center of the holding surface 210a of the holding pad 21 and of which the axial direction is in the Z-axis direction.

At an intermediate portion of a side surface on the +X direction side of the column 11 depicted in FIG. 1, namely, on the lower side of a moving route of the holding means 2, there are disposed: a rotary roller 18 having an axis in the X-axis direction; whole body peeling means 4 for peeling the whole body of the protective member S from the wafer W; a mount table 5 on which the protective member S peeled from the wafer W is mounted; and dropping means 6 for dropping the protective member S on the mount table 5, these components being arranged in this order from the +Z direction side. In the vicinity of and on the +Y direction side of the whole body peeling means 4, a table holding base 140 is disposed in the state of being fixed to a side surface on the +X direction side of the column 11, and a transfer table 141 on which to place the wafer W after grinding is disposed on the table holding base 140. The transfer table 141 can suction hold the wafer W placed on a holding surface thereof. Note that a configuration may be adopted wherein the transfer table 141 is not disposed on the table holding base 140.

On the table holding base 140, outside portion peeling means 3 for grasping the protruding portion S2a and peeling outside portions of the protective member S from the wafer W are disposed at positions spaced apart by 180 degrees, with the transfer table 141 interposed therebetween. Note that a plurality of outside portion peeling means 3 may be disposed on the table holding base 140 at predetermined intervals along the circumferential direction (for example, four outside portion peeling means 3 may be disposed at intervals of 90 degrees). Note that in FIG. 1, the configuration of the outside portion peeling means 3 is depicted in a simplified form.

Figure 3:
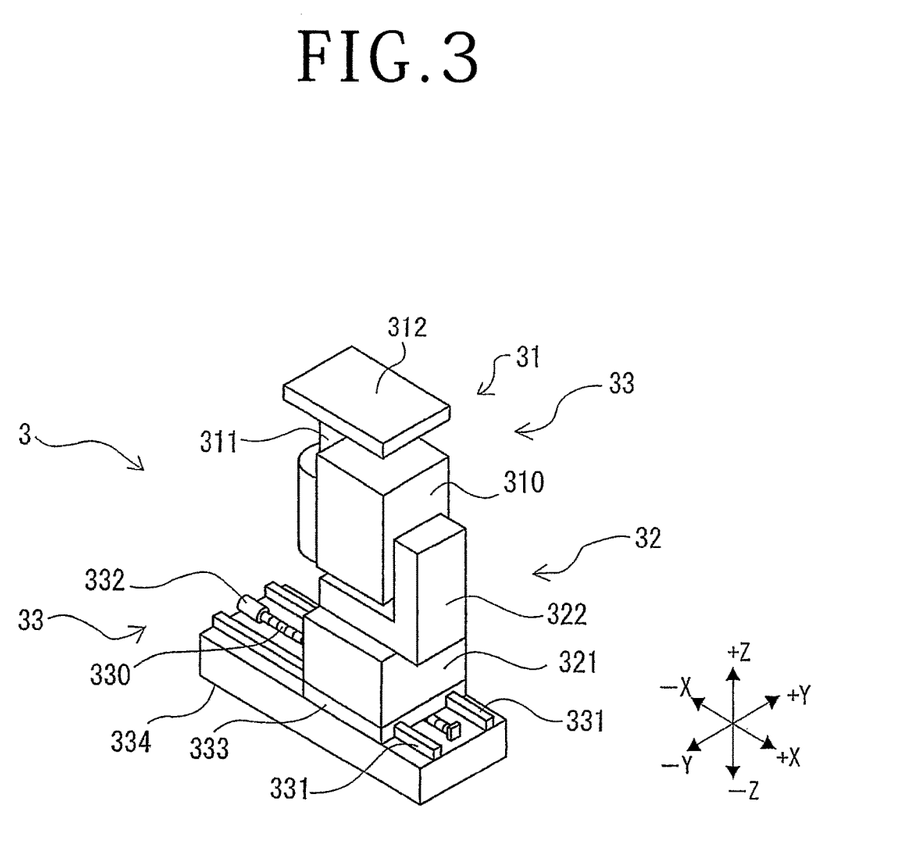
FIG. 3 is a perspective view depicting an example of the outside portion peeling means.

The outside portion peeling means 3 depicted in FIGS. 2 and 3 includes: first grasping means 31 for grasping the protruding portion S2a; a vertical movement section 32 by which the first grasping section 31 is moved in a direction perpendicular to the holding surface 210a of the holding means 2; and a horizontal movement section 33 by which the first grasping section 31 is moved in the holding surface direction (X-axis direction) of the holding surface 210a of the first grasping section 31.

As illustrated in FIG. 3, the horizontal movement section 33 is composed, for example, of a ball screw 330 having an axis in the X-axis direction, a holding plate 334 on which the ball screw 330 is disposed, a pair of guide rails 331 disposed on the holding plate 334 in parallel to the ball screw 330, a motor 332 for rotating the ball screw 330, and a movable block 333 which is provided therein with a nut for screw engagement with the ball screw 330 and of which a bottom portion makes sliding contact with the guide rails 331. When the ball screw 330 is rotated by the motor 332, the movable block 333 is attendantly moved in the X-axis direction while being guided by the guide rails 331, and the first grasping section 31 disposed on the movable block 333 is moved in the X-axis direction attendant on the movement of the movable block 333.

For example, as depicted in FIG. 2, the vertical movement section 32 includes a first lift cylinder 321 fixed on the movable block 333, and a second lift cylinder 322 fixed to an upper end of a piston rod 321c of the first lift cylinder 321. The first lift cylinder 321 includes a cylinder tube 321a which is provided therein with a piston 321b and has a bottom on a base end side (−Z direction side), and the piston rod 321c which is inserted in the cylinder tube 321a and of which a lower end is attached to the piston 321b. A cylinder tube 322a of the second lift cylinder 322 is fixed to an upper end of the piston rod 321c. In addition, the cylinder tube 321a is fixed on the base end side thereof to an upper surface of the movable block 333. When air is supplied into (or discharged from) the cylinder tube 321a and the pressure inside the cylinder tube 321a is varied thereby, the piston rod 321c is moved in the Z-axis direction, whereby the second lift cylinder 322 and the first grasping section 31 are moved in the Z-axis direction.

The second lift cylinder 322 has a configuration such that, for example, a piston 322b disposed in the cylinder tube 322a substantially L-shaped as viewed from the Y-axis direction side is moved in the Z-axis direction by air supplied into the cylinder tube 322a, and the first gasping section 31 is fixed to the piston 322b. Note that the vertical movement section 32 is not limited to the configuration in this embodiment, and may, for example, have a configuration wherein the first lift cylinder 321 and the second lift cylinder 322 are composed of a single lift cylinder.

The first grasping section 31 includes a substantially rectangular parallelepiped-shaped clamp base 310, a clamp cylinder 311 disposed on a lateral side of the clamp base 310, and a clamp plate 312 moved upward and downward in the Z-axis direction, and an object to be clamped can be clamped between an upper surface of the clamp base 310 and a lower surface of the clamp plate 312.

The whole body peeling means 4 depicted in FIG. 1 includes a second grasping section 41 for grasping the protruding portion S2a, and moving means 40 for moving the second grasping section 41 in the Y-axis direction. The moving means 40 is composed of a ball screw 400 having an axis in the Y-axis direction, a pair of guide rails 401 disposed in parallel to the ball screw 400, a motor 402 for rotating the ball screw 400, and a movable block 403 which is provided therein with a nut for screw engagement with the ball screw 400 and of which a side portion makes sliding contact with the guide rails 401. When the motor 402 rotates the ball screw 400, the movable block 403 is attendantly moved in the Y-axis direction while being guided by the guide rails 401, and the second grasping section 41 disposed on the movable block 403 is moved in the Y-axis direction attendant on the movement of the movable block 403.

The second grasping section 41 includes a spindle 410 of which an axial direction is in the X-axis direction, a housing 411 by which the spindle 410 is supported rotatably, and a clamp 412 disposed at a tip on the +X direction side of the spindle 410. The clamp 412 can clamp an object to be clamped between a pair of clamping plates which can come closer to and away from each other, and the angle of the clamp 412 relative to the object to be clamped can be varied by rotating the spindle 410. Note that, for example, the second grasping section 41 may be configured such as to be vertically movable on the movable block 403.

The rotary roller 18 is formed in a cylindrical outer shape, for example, and is rotated by a motor (not depicted) about its axis set in the X-axis direction. The rotary roller 18 makes contact with the protective member S, thereby playing the role of preventing sharp bending of a resin S1 depicted in FIG. 2 which might occur, for example, at the time of peeling of the protective member S. Note that the rotary roller 18 may be able to be moved in the Y-axis direction.

The mount table 5 on which to mount the protective member S peeled from the wafer W is, for example, substantially rectangular in outer shape, and is provided with a drainboard-like mount surface 5a. Specifically, the mount table 5 has rectilinear members 50 arranged in parallel with one another, with their longitudinal direction set in the Y-axis direction and at regular intervals in the X-axis direction, wherein +Y axis direction side ends of the rectilinear members 50 are fixed by connecting them by rod-shaped connecting means (not depicted). For example, the mount table 5 is fixed to a side surface on the +X direction side of the column 11 by the rod-shaped connecting means (not depicted) that connects the rectilinear members 50. Alternatively, the mount table 5 is disposed under the moving route of the whole body peeling means 4, by a structure wherein a part of a lower surface 5b of the mount table 5 is fixed onto side surfaces of a pair of guide rails 61 of the dropping means 6 which will be described later.

The dropping means 6 for dropping the protective member S on the mount table 5 includes: a ball screw 60 having an axis in the Y-axis direction; the pair of guide rails 61 disposed in parallel to the ball screw 60; a motor 62 for rotating the ball screw 60; a movable member 63 which is provided therein with a nut for screw engagement with the ball screw 60 and of which a side portion 630 makes sliding contact with the guide rails 61; and projecting pins 64 disposed on the movable member 63.

The movable member 63 includes the side portion 630 which makes screw engagement with the ball screw 60, and a pin base portion 631 formed to project toward the +X direction side from a side surface of an upper end portion of the side portion 630. At an upper surface of the pin base portion 631, there are disposed two projecting pins 64 projecting in the +Z direction. The projecting pins 64 are disposed at a predetermined interval in the X-axis direction. When the ball screw 60 is rotated by the motor 62, the movable member 63 is attendantly moved in the Y-axis direction while being guided by the guide rails 61, and the projecting pins 64 disposed on the movable member 63 are moved in the Y-axis direction such as to pass gaps between the rectilinear members 50 of the mount table 5.

A box 7 for accommodating the peeled protective members S is disposed on the base 10. The box 7 is, for example, substantially rectangular parallelepiped in outer shape, and is opening under a +Y direction side end of the mount table 5. For example, a transmission type photosensor 79 having a light emitting section 790 (−Y direction side) and a light receiving section 791 (+Y direction side) is disposed at an upper portion of the box 7. The protective member S peeled from the wafer W and mounted on the mount table 5 is dropped by the dropping means 6 into the box 7 sequentially, the protective members S are stacked inside the box 7 to a predetermined height, and inspection light between the light emitting section 790 and the light receiving section 791 is intercepted by the protective member S, whereby the photosensor 79 detects that the box 7 has been filled up with the protective members S.

Now, steps of the peeling method and operations of the peeling apparatus 1 depicted in FIG. 1, in the case of peeling the protective member S from the wafer W by performing the peeling method according to the present invention by use of the peeling apparatus 1, will be described below. Note that in the drawings, the configuration of the peeling apparatus 1 is depicted in a simplified form.

(1) Holding Step

First, a ground wafer W depicted in FIG. 1 is mounted on the transfer table 141 in such a manner that the other side Wb, or the ground side, of the wafer W is on the upper side. The holding means 2 is moved in the +Y direction, and is positioned over the wafer W in such a manner that the center of the holding surface 210a of the holding pad 21 coincides substantially with the center of the other side Wb of the wafer W. Further, the holding means 2 is lowered in the −Z direction, and the holding surface 210a of the holding pad 21 is brought into contact with the other side Wb of the wafer W. Further, a suction force generated by suction by the suction source 213 is transmitted to the holding surface 210a, whereby the other side Wb of the wafer W is suction held by the holding means 2, with the protective member S on the lower side, as depicted in FIG. 2. Here, the protective member S is composed of the resin S1 and the film S2, and the film S2 is attached to one side Wa of the wafer W through the resin S1.

(2) Outer Circumferential Edge Adhered Resin Peeling Step

Figure 4:
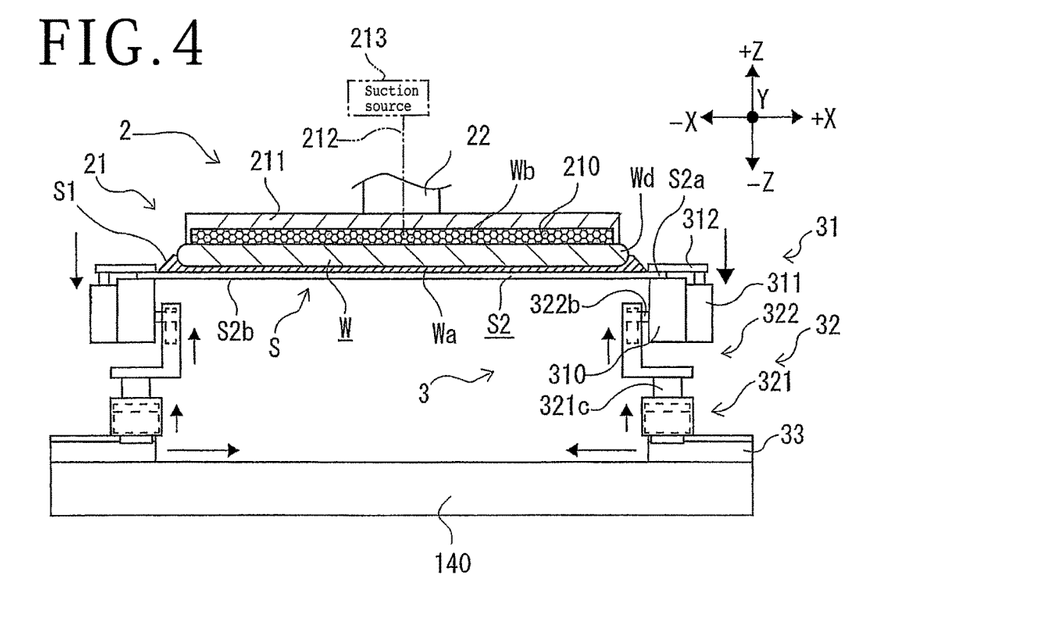
FIG. 4 is a sectional view depicting a state in which a protruding portion of a protective member for a wafer held by the holding means is grasped by a first grasping section.

For example, the holding means 2 holding the wafer W by suction is moved in the +Z direction, to separate the wafer W from the transfer table 141. Next, as depicted in FIG. 4, air is supplied to the first lift cylinder 321 and the second lift cylinder 322, whereby the piston rod 321c and the piston rod 322b are raised, and the first grasping section 31 is positioned at a predetermined height position such that the upper surface of a clamp base 310 is positioned at a height position comparable to that of the lower surface S2b of the protective member S. In addition, each horizontal movement section 33 moves each first grasping section 31 in the −X direction and the +X direction, to perform position matching between the first grasping section 31 and the protruding portion S2a of the protective member S. A clamp plate 312 is lowered by the clamp cylinder 311, and the protruding portion S2a of the protective member S for the wafer W is clamped between the upper surface of the clamp base 310 and the lower surface of the clamp plate 312, whereby the protruding portion S2a of the protective member S for the wafer W is grasped by the first grasping section 31. Note that the grasping of the protruding portion S2a of the protective member S for the wafer W by the first grasping section 31 and the like operation may be conducted while keeping the wafer W held on the transfer table 141.

Figure 5:
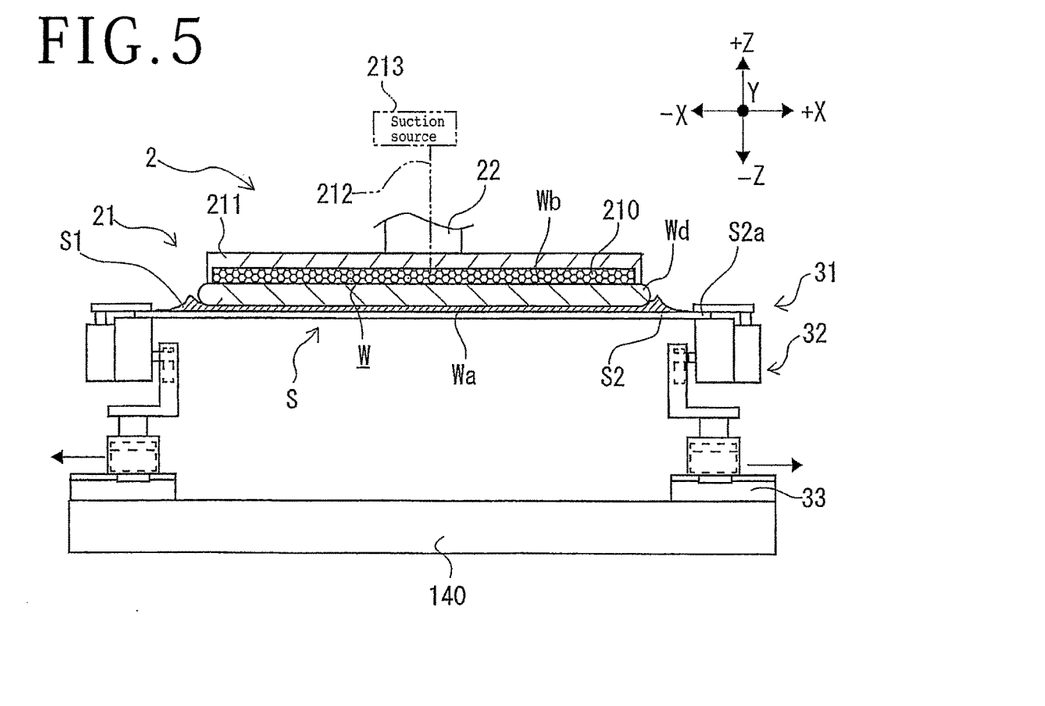
FIG. 5 is a sectional view depicting a state in which the first grasping section grasping the protruding portion is moved to an outer side than an outer circumferential edge of the wafer to pull the protruding portion, thereby peeling a resin adhered to the outer circumferential portion of the wafer.

Subsequently, as depicted in FIG. 5, each first grasping section 31 grasping the protruding portion S2a of the protective member S for the wafer W is moved toward the radially outer side than the outer circumferential edge Wd of the wafer W by each horizontal movement section 33, whereby the protruding portion S2a (which is a portion constituting the outside portion of the film S2) is pulled and extended toward the radially outer side by the first grasping section 31. By the movement of the first grasping section 31, the resin S1 adhered to the outer circumferential edge Wd of the wafer W is easily peeled toward the radially outer side from the outer circumferential edge Wd of the wafer W, under the extending force which is exerted from the protruding portion S2a of the film S2 onto the resin S1 adhered to the outer circumferential edge Wd of the wafer W and an adhesive force which acts between the film S2 and the resin S1.

(3) Whole Body Peeling Step

Figure 6:
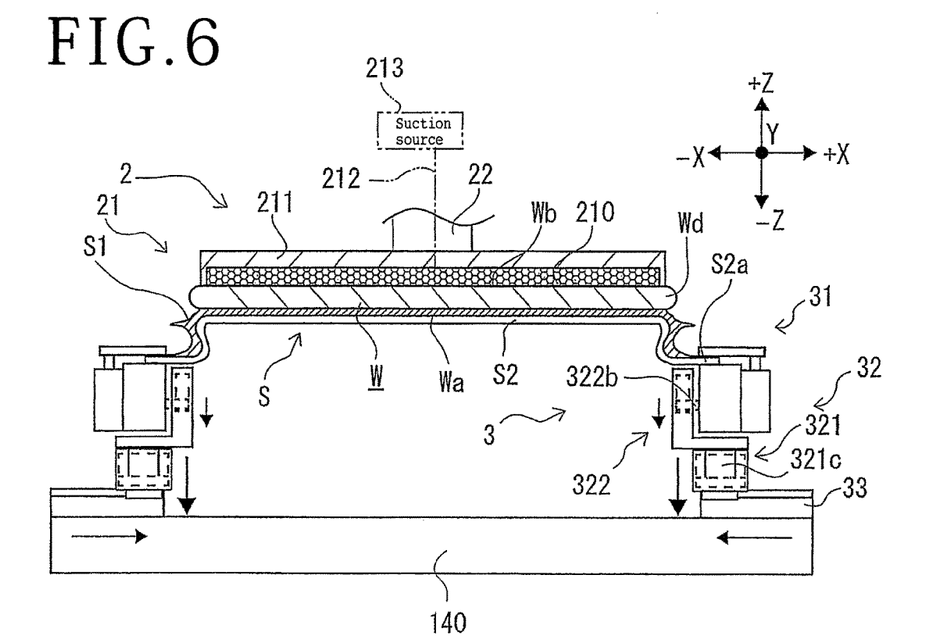
FIG. 6 is a sectional view depicting a state in which the first grasping section grasping the protruding portion is moved in a direction for spacing away from a holding surface of a holding pad by a vertical movement section, thereby peeling an outside portion of the protective member.

After the outer circumferential edge adhered resin peeling step is conducted, the first grasping section 31 is moved in a direction (−Z direction) for spacing away from the one side Wa of the wafer W by the vertical movement section 32, to peel an outside portion of the protective member S from the wafer W, as depicted in FIG. 6. Specifically, air is discharged from the first lift cylinder 321 and the second lift cylinder 322, whereby the piston rod 321c and the piston rod 322b are lowered, and each first grasping section 31 grasping the protruding portion S2a of the protective member S gradually peels an outside portion of the protective member S in the −Z direction from the wafer W. In this instance, since the resin S1 adhered to the outer circumferential edge Wd of the wafer W has already been peeled from the outer circumferential edge Wd of the wafer W, the outside portion of the protective member S can be easily peeled from the wafer W, without leaving the resin S1 on the outer circumferential edge Wd of the wafer W.

A process may be adopted wherein, for example, after each grasping section 31 is lowered to a predetermined height position to peel the outside portion of the protective member S from the wafer W to a certain extent, as depicted in FIG. 6, each first grasping section 31 grasping the protruding portion S2a of the protective member S for the wafer W is moved by each horizontal movement section 33 toward the radially inner side than the outer circumferential edge Wd of the wafer W, whereby the outside portion of the protective member S is peeled from the wafer W.

After the peeling of the outside portion of the protective member S is thus conducted at two symmetric positions of the outer circumferential edge Wd of the wafer W, the first grasping sections 31 release the protruding portion S2a of the protective member S. Then, the rotating means 22 depicted in FIG. 6 rotates the holding pad 21 suction holding the wafer W by, for example, 90 degrees about the Z axis, to position the wafer W relative to the outside portion peeling means 3 such that the first grasping sections 31 face two symmetric positions of the outer circumferential edge Wd of the wafer W where peeling of the outside portion of the protective member S has not been performed. Then, each of the steps of the outer circumferential edge adhered resin peeling step and the peeling of the outside portion of the protective member S which have been described above referring to FIGS. 4 to 6 are conducted, to peel the outside portion of the protective member S from the wafer W at a plurality of parts. For example, each of the steps of the outer circumferential edge adhered resin peeling step and the peeling of the outside portion of the protective member S from the wafer W are conducted at a total of at least eight parts of the outer circumferential edge Wd of the wafer W, at regular angular intervals along the circumferential direction, with the center of the wafer W as a reference. Note that in the case where the wafer W is a wafer having a large diameter, it is preferable to further increase the number of parts at which the outside portion of the protective member S is peeled from the wafer W.

Figure 7:
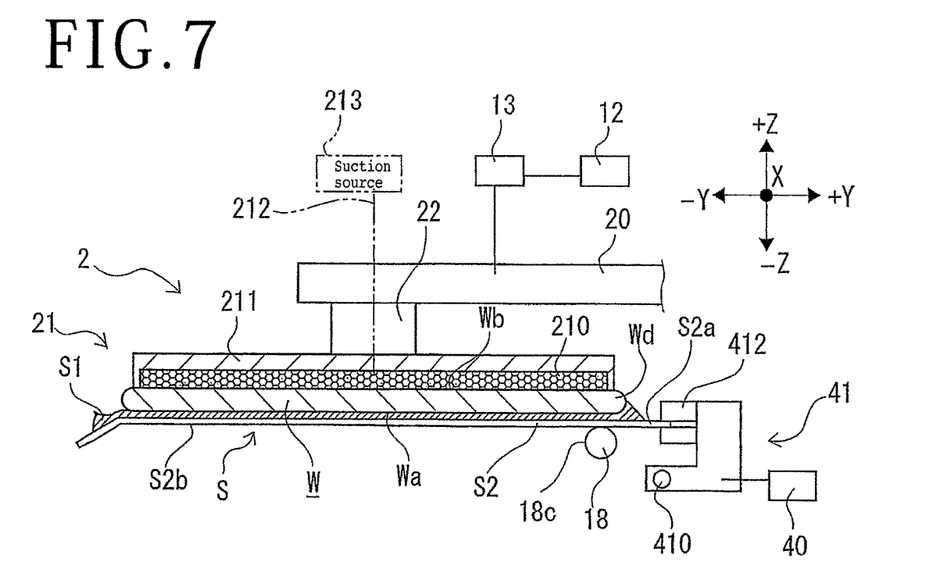
FIG. 7 is a sectional view depicting a state in which the protruding portion of the protective member for the wafer held by the holding means is grasped by a second grasping section.

Subsequently, as depicted in FIG. 7, the holding means 2 suction holding the wafer W is moved in the −Y direction until positioned over the rotary roller 18, and is thereafter lowered in the −Z direction, whereby a side surface 18c of the rotary roller 18 is put into contact with the vicinity of an outer circumferential portion on the +Y direction side of the lower surface S2b of the protective member S. Moving means 40 moves the second grasping section 41 in the −Y direction, to perform position matching between a clamp 412 and the protruding portion S2a of the protective member S, and the clamp 412 clamps the protruding portion S2a. While the second grasping section 41 grasps the protruding portion S2a at that part of the outside portion of the protective member S at which the peeling from the wafer W has not yet been conducted, in the example illustrated in FIG. 7, the second grasping section 41 may grasp the protruding portion S2a at that part of the outside portion of the protective member S at which the peeling from the wafer W has already been conducted (the protruding portion S2a on the −Y direction side in FIG. 7).

Figure 8:
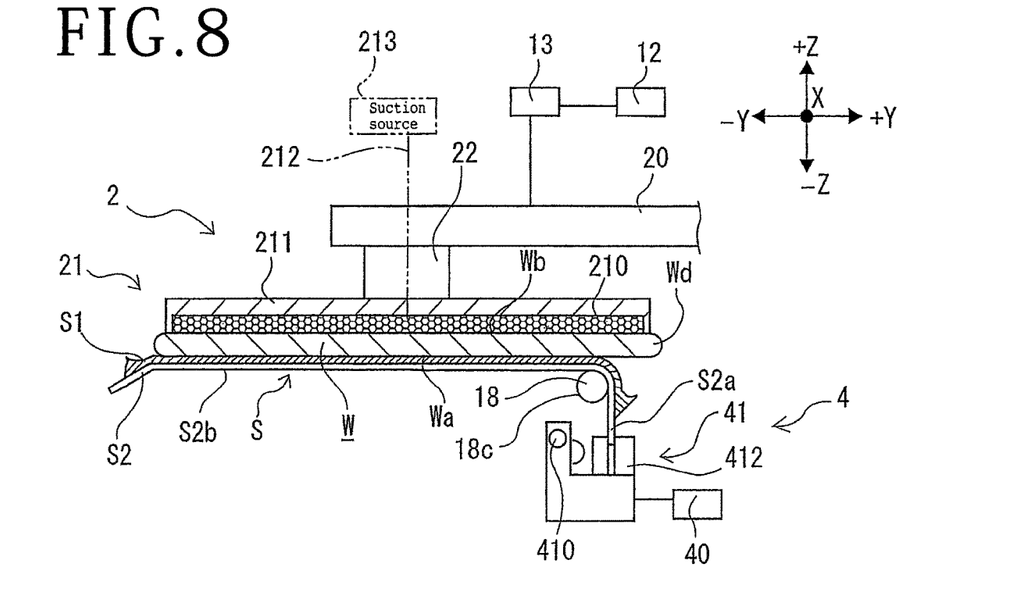
FIG. 8 is a sectional view depicting a state in which the second grasping section grasping the protruding portion of the protective member is moved by moving means, to thereby start peeling of the whole body of the protective member from the wafer.

For example, as illustrated in FIG. 8, after the clamp 412 has clamped the protruding portion S2a, a spindle 410 is rotated by 90 degrees clockwise as viewed from the +X direction side. By this, in a state in which the rotary roller 18 supports the lower surface S2b side of the protective member S, and while the resin S1 of the protective member S is being gently bent along the side surface 18c of the rotary roller 18, the protective member S is pulled in the −Z direction by the clamp 412, whereby a part of the protective member S is peeled from the one side Wa of the wafer W.

Next, the second grasping section 41 is moved toward the −Y direction side by the moving means 40, and, for example, the Y-axis direction moving means 12 moves the holding means 2 toward the +Y direction side, whereby the second grasping section 41 is relatively moved from an outer circumference on the +Y direction side of the wafer W toward an outer circumference on the −Y direction side, with the center as a reference. In addition, the rotary roller 18 is rotated about an axis set in the X-axis direction, and while the resin S1 of the protective member S is kept gently bent along the side surface 18c of the rotary roller 18, the protective member S is gradually peeled from the outer circumferential edge Wd on the +Y direction side of the wafer W toward the center of the wafer W. If sharp bending of the resin S1 occurs during peeling of the protective member S, the resin S1 would be partly left on the wafer W even after peeling, or an impact would instantaneously exerted on the one side Wa of the wafer W from the resin S1 due to a reaction of the sharp bending of the resin S1 and the one side Wa of the wafer W may be damaged thereby. Where the side surface 18c of the rotary roller 18 is in contact with the film S2, such a problem can be prevented from occurring.

Figure 9:
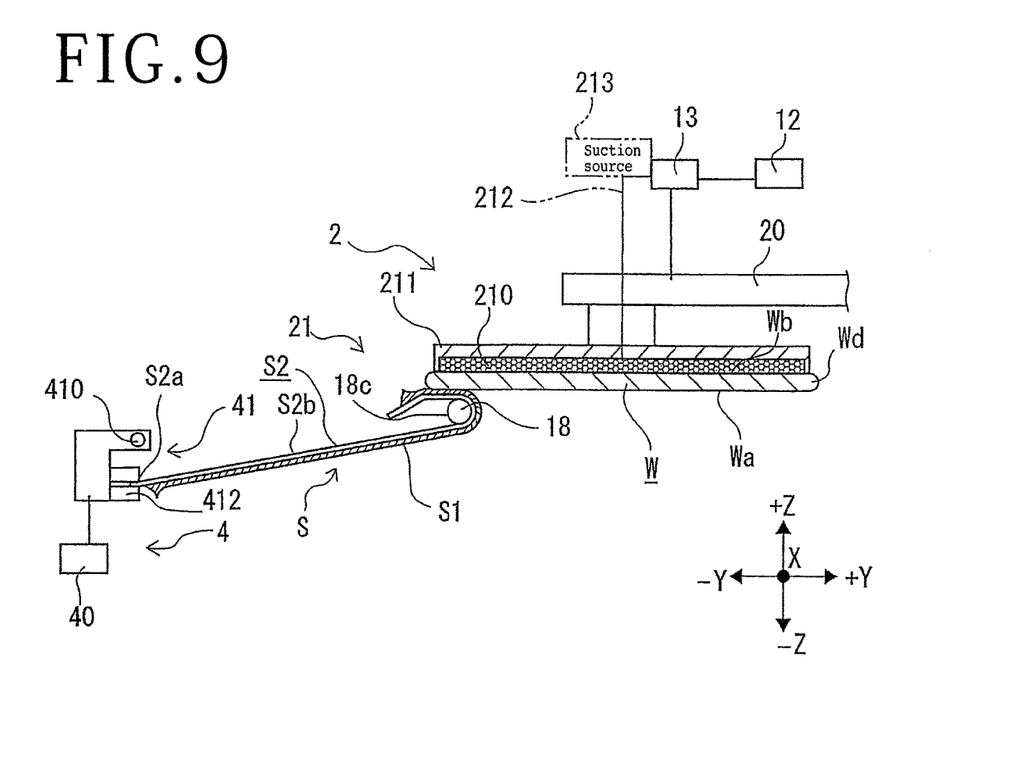
FIG. 9 is a sectional view depicting a state in which the second grasping section grasping the protruding portion of the protective member is moved by moving means, to thereby peel most part of the protective member from the wafer.

As depicted in FIG. 9, when the second grasping section 41 is moved to the vicinity of the outer circumferential edge Wd on the −Y direction side of the wafer W, the spindle 410 is rotated further by 90 degrees clockwise as viewed from the +X direction side, whereby the resin S1 side of the protective member S is directed downward. Further, the Y-axis direction moving means 12 moves the holding means 2 toward the +Y direction side, and the second grasping section 41 is moved toward the −Y direction side by the moving means 40, whereby the whole body of the protective member S is peeled completely from the wafer S. When the whole body of the protective member S has been peeled completely from the wafer W, the clamp 412 is opened to release the grasping of the protruding portion S2a by the second grasping section 41, and the protective member S is dropped toward the mount table 5 depicted in FIG. 1, with the resin S1 side down.

The peeling method according to the present invention includes: an outer circumferential edge adhered resin peeling step of grasping a protruding portion S2a of a protective member S for a wafer W held in a holding step, and pulling the protruding portion to an outer side than an outer circumferential edge Wd of the wafer W to peel a resin S1 adhered to the outer circumferential edge Wd of the wafer W from the outer circumferential edge Wd of the wafer W; and a whole body peeling step of peeling, after the outer circumferential edge adhered resin peeling step, the whole body of the protective member S from the wafer W. According to the peeling method, therefore, the resin S1 adhered to the outer circumferential edge Wd of the wafer W can be peeled from the outer circumferential edge Wd of the wafer W, by the simple operation of grasping and pulling the protruding portion S2a in the outer circumferential edge adhered resin peeling step, and independently of the rigidity of the resin S1. After the outer circumferential edge adhered resin peeling step is performed, the protruding portion S2a is drawn downward to peel an outside portion of the protective member S from the wafer W, and, further, the whole body of the protective member S is peeled from the wafer W, whereby the whole body of the protective member S can be easily peeled from the wafer W, without leaving the resin on the outer circumferential edge Wd of the wafer W. In addition, the peeling apparatus 1 according to the present invention has an optimum apparatus configuration for carrying out the peeling method according to the present invention. By use of the peeling apparatus 1, the resin S1 adhered to the outer circumferential edge Wd of the wafer W can be peeled from the outer circumferential edge Wd of the wafer W, by the simple operation of grasping and pulling the protruding portion S2a by the first grasping section 31, and the whole body of the protective member S can be easily peeled from the wafer W without leaving the resin S1 on the outer circumferential edge Wd of the wafer W.

The holding means 2 of the peeling apparatus 1 according to the present invention includes the rotating means 22 for rotating the holding surface 210a about the center of the holding surface 210a. This configuration ensures that a series of steps of peeling the resin S1 adhered to the outer circumferential edge Wd of the wafer W from the outer circumferential edge Wd of the wafer W and further peeing an outside portion of the protective member S from the wafer W can be carried out at a plurality of parts of the outer circumferential edge Wd of the wafer W, easily by rotating the holding surface 210a on which the wafer W is held.

Note that the peeling method according to the present invention is not limited to the above-described embodiment. In addition, the size, shape and the like of each component of the peeling apparatus 1 illustrated in the attached drawings are not limited to the illustrated ones, and appropriate modifications are possible within such ranges that the advantageous effect of the present invention can be produced. For example, a configuration may be adopted wherein in the whole body peeling step, the second grasping section 41 is not moved in the Y-axis direction but only the holding means 2 is moved in the Y-axis direction, whereby the whole body of the protective member S is peeled from the wafer W.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A peeling apparatus for peeling a protective member from a wafer, the protective member including a resin and a film, the film attached to one side of the wafer through the resin in a state in which the film protrudes from an outer circumferential edge of the wafer to form a protruding portion, the peeling apparatus comprising:

holding means having a holding surface on which to hold the other side of the wafer;

outside portion peeling means for grasping the protruding portion and peeling an outside portion of the protective member from the wafer; and whole body peeling means for peeling the whole body of the protective member from the wafer, wherein the outside portion peeling means includes a first grasping section for grasping the protruding portion, a vertical movement section for moving the first grasping section in a direction perpendicular to the holding surface, and a horizontal movement section for moving the first grasping section in a direction of the holding surface, the whole body peeling means includes a second grasping section for grasping the protruding portion, and moving means for moving the second grasping section from an outer circumference of the wafer toward an outer circumference on the opposite side with reference to the center of the wafer, and the protruding portion of the protective member for the wafer held by the holding means is grasped by the first grasping section, the first grasping section is moved to an outer side than an outer circumferential edge of the wafer by the horizontal movement section, and the protruding portion is pulled to peel the resin adhered to the outer circumferential edge of the wafer, after which the first grasping section is moved in a direction for spacing away from the one side of the wafer by the vertical movement section to peel an outside portion of the protective member, and, further, the protruding portion is grasped by the second grasping section and the second grasping section is relatively moved from an outer circumference of the wafer toward an outer circumference on the opposite side with reference to the center of the wafer to peel the whole body of the protective member.

2. The peeling apparatus according to claim 1, wherein the holding means includes rotating means for rotating the holding surface about the center of the holding surface.

* * * * *